(12) United States Patent
Yada et al.

(10) Patent No.: US 7,534,120 B2
(45) Date of Patent: May 19, 2009

(54) FOLDABLE INFORMATION PROCESSING APPARATUS HAVING PROTECTED CRANK-TYPE STRUCTURED FLEXIBLE PRINTED CIRCUIT BOARD

(75) Inventors: Haruyoshi Yada, Kawasaki (JP); Takashi Suzuki, Kawasaki (JP); Tomoyuki Nagamine, Kawasaki (JP); Manabu Hongo, Kawasaki (JP); Kazunori Murayama, Kawasaki (JP); Yoshiya Matsumoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 380 days.

(21) Appl. No.: 11/359,388

(22) Filed: Feb. 23, 2006

(65) Prior Publication Data
US 2007/0123078 A1    May 31, 2007

(30) Foreign Application Priority Data
Nov. 30, 2005   (JP) ............................. 2005-347247

(51) Int. Cl.
*H01R 3/00* (2006.01)
(52) U.S. Cl. .................................................... 439/164
(58) Field of Classification Search .................. 439/165, 439/164, 67, 77; 174/254, 261, 492; 455/550.1, 455/556.2; 361/755, 681
See application file for complete search history.

(56) References Cited

U.S. PATENT DOCUMENTS

| | | | | | |
|---|---|---|---|---|---|
| 4,825,395 | A | * | 4/1989 | Kinser et al. ................. | 361/680 |
| 5,278,725 | A | * | 1/1994 | Konno et al. ................. | 361/680 |
| 5,701,067 | A | * | 12/1997 | Kaji et al. .................... | 320/101 |
| 5,834,705 | A | * | 11/1998 | Jonaidi ........................ | 174/261 |
| 6,215,454 | B1 | * | 4/2001 | Tran ............................ | 343/841 |
| 6,324,055 | B1 | * | 11/2001 | Kawabe ....................... | 361/687 |
| 6,439,905 | B2 | * | 8/2002 | Andrews et al. ............. | 439/165 |
| 6,447,314 | B1 | * | 9/2002 | Kato et al. ................... | 439/165 |
| 6,475,024 | B1 | * | 11/2002 | Narui .......................... | 439/495 |
| 6,872,088 | B2 | * | 3/2005 | Watanabe .................... | 439/165 |
| 7,054,147 | B2 | * | 5/2006 | Maatta et al. ................ | 361/681 |
| 7,142,433 | B2 | * | 11/2006 | Lechner et al. .............. | 361/797 |
| 7,148,785 | B2 | * | 12/2006 | Becker et al. ............. | 338/22 R |
| 2004/0112632 | A1 | * | 6/2004 | Michiwaki et al. .......... | 174/254 |

FOREIGN PATENT DOCUMENTS

JP   2003-198155   7/2003
JP   2004-7218     1/2004

* cited by examiner

*Primary Examiner*—Chandrika Prasad
(74) *Attorney, Agent, or Firm*—Kratz, Quintos & Hanson, LLP (57) ABSTRACT

A foldable information processing apparatus includes a hinge part that foldably couples two housings with each other, a crank-type structured flexible printed circuit board that passes through the hinge part and electrically connects the two housings to each other, and a protector that protects an end surface of the flexible printed circuit board from a contact with the hinge part.

6 Claims, 10 Drawing Sheets

FOLDABLE INFORMATION PROCESSING APPARATUS HAVING PROTECTED CRANK-TYPE STRUCTURED FLEXIBLE PRINTED CIRCUIT BOARD

This application claims the right of foreign priority under 35 U.S.C. §119 based on Japanese Patent Application No. 2005-347247, filed on Nov. 30, 2005, which is hereby incorporated by reference herein in its entirety as if fully set forth herein.

BACKGROUND OF THE INVENTION

The present invention relates generally to a foldable information processing apparatus, such as a cell phone (including a personal digital cellular ("PDC"), a personal handy phone system ("PHS"), and another mobile communication terminal, which are generally referred to as "mobile radio communication apparatuses"), and more particularly to an internal structure of its hinge part.

Along with recent widespread of the mobile radio communication apparatuses, various demands have been made on them including an improved operability and durability of each component, and a smaller housing.

In general, the cell phone is classified into a foldable cell phone and a rod-type cell phone. Among them, the foldable cell phone typically has a movable-side housing with a liquid crystal display ("LCD" hereinafter) screen and a fixed-side housing with a ten-key, and make them foldable through a hinge part. A connector passes through the hinge part in the foldable cell phone between the movable-side housing and the fixed-side housing, and electrically connects the movable-side housing to the fixed-side housing to each other. In general, the connector is made of a cable line and a flexible printed circuit board ("FPC" hereinafter) between substrates. The cable includes, for example, a coaxial cable used to transmit a high-frequency signal. The FPC is used, for example, to connect both printed boards of the movable-side housing and fixed-side housing to each other, and transmit various signals between these printed boards.

The FPC is classified into a curl-type structure in which the FPC is curled once in the hinge part, and a crank-type structure in which the FPC is twisted and bent in the hinge part. Although the curl-type structure is the current mainstream, the crank-type structure enables the external form of the hinge part to be smaller than the curl-type structure. Therefore, the future demand of the crank-type structure is expected since it contributes to the miniaturization of the cell phone.

Prior art includes, for example, Japanese Patent Applications, Publication Nos. 2004-7218 and 2003-198155.

In the foldable cell phone, a path for the FPC when the movable-side housing opens is longer than that when the movable-side housing closes. Since the FPC's path length is thus different between the opening and closing states of the movable-side housing, the FPC is pulled too tight to close, torn or stretched out so that its internal circuit is broken, if the FPC's length is set to the path length in the opening state of the movable-side housing. Thus, the FPC's length should be set based on the path length in the closing state of the movable-side housing. As a result, the FPC has an extra length to the path length of the opening state of the movable-side housing.

However, due to this extra length, the FPC's end surface is pressed against the internal surface of the hinge part when the movable-side housing is opened and closed, generating the rustle of frictional noises, and lowering the operability or operational comfort. The substrate of the FPC is made generally of resin, such as polyimide. On the other hand, the hinge part is made of a hard metal material, such as zinc and SUS sintered member so as to protect the connector and stabilize the joint between the fixed-side housing and the movable-side housing. Therefore, when the FPC and hinge part rub against each other, the FPC's end surface wears away. As the FPC's wear advances, the FPC's signal line exposes and breaks down, consequently lowering the durability of the foldable cell phone.

BRIEF SUMMARY OF THE INVENTION

Accordingly, it is an exemplified object of the present invention to provide a foldable information processing apparatus that adopts the crank-type FPC for the miniaturization of the apparatus and improves the operability and durability.

A foldable information processing apparatus according to one aspect of the present invention includes a hinge part that foldably couples two housings with each other, a crank-type structured flexible printed circuit board that passes through the hinge part and electrically connects the two housings to each other, and a protector that protects an end surface of the flexible printed circuit board from a contact with the hinge part. According to the foldable information processing apparatus, the protector protects the FPC's end surface from contact and wear, prevents the frictional noises and disconnection of the signal line and improves the operability and durability.

The protector may be a resin member that is provided on an inner surface of the hinge part, prevents the end surface of the flexible printed circuit board from contacting the hinge part, and contacts the end surface of the flexible printed circuit board. The FPC is generally made of resin, such as polyimide, and the wear is mitigated in case of a contact between resin and resin in comparison with a contact between resin and metal. The resin material includes Teflon, Kapton, and POM, etc.

The resin member may include a tape. The protector may be a member that is provided on the flexible printed circuit board, extends along an inner surface of the hinge part, and contacts the hinge part instead of the end surface of the flexible printed circuit board. Such a member provides a surface contact, instead of a linear contact like the end surface, improving the slip characteristic on the internal surface in the hinge part, and reducing the friction.

The member may be a part of the flexible printed circuit board. Since the member does not have to be formed as a separate member, this configuration facilitates the assembly, and reduces the cost by reducing the number of components. The he flexible printed circuit board may include plural layers, and the member is one of layers at both end layers in the plural layers. This configuration can protect the end surface by covering it with one of the end layers. The member preferably dispenses with a signal line in the flexible printed circuit board. This configuration can prevent the break of the signal line.

Other objects and further features of the present invention will become readily apparent from the following description of preferred embodiments with reference to the accompanying drawings.

DETAILED DESCRIPTION OF THE PREFERRED EMBODIMENTS

Figure 1A:
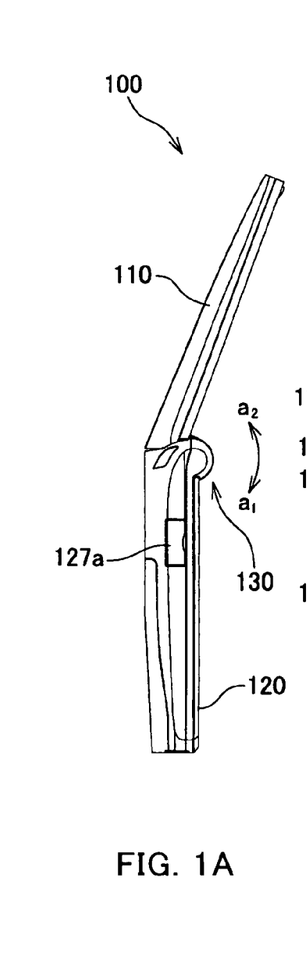
FIGS. 1A and 1B are side and front views when a cell phone as an inventive foldable information processing apparatus opens.
Figure 1B:
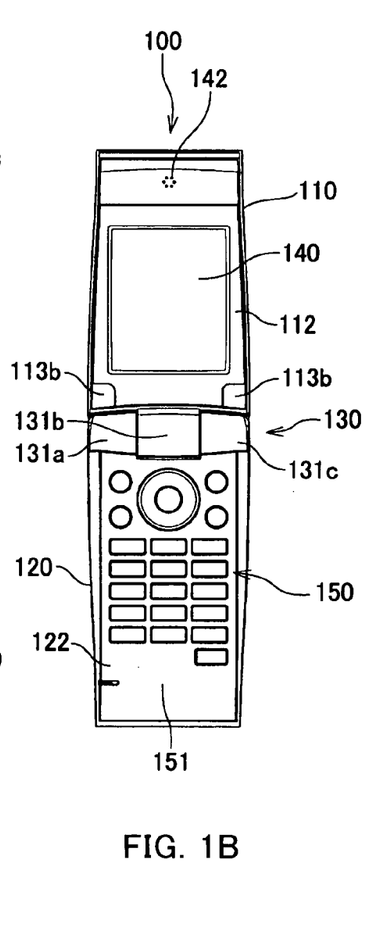
Figure 1C:
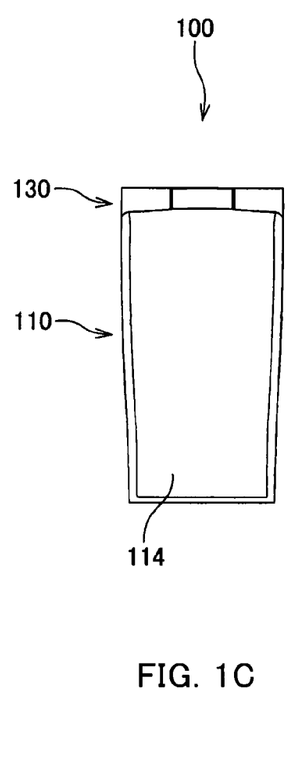
FIGS. 1C-1E are top, side and rear views when the cell phone closes.
Figure 1D:
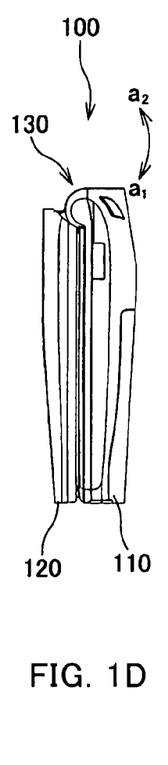
Figure 1E:
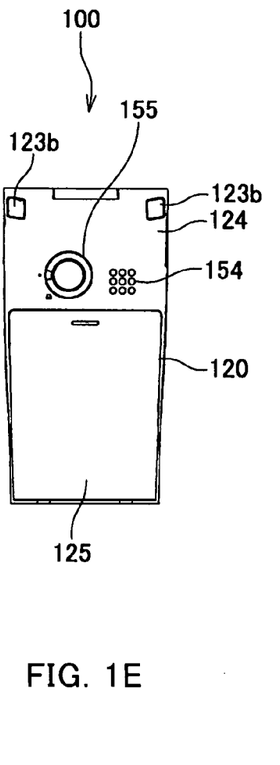
Figure 2:
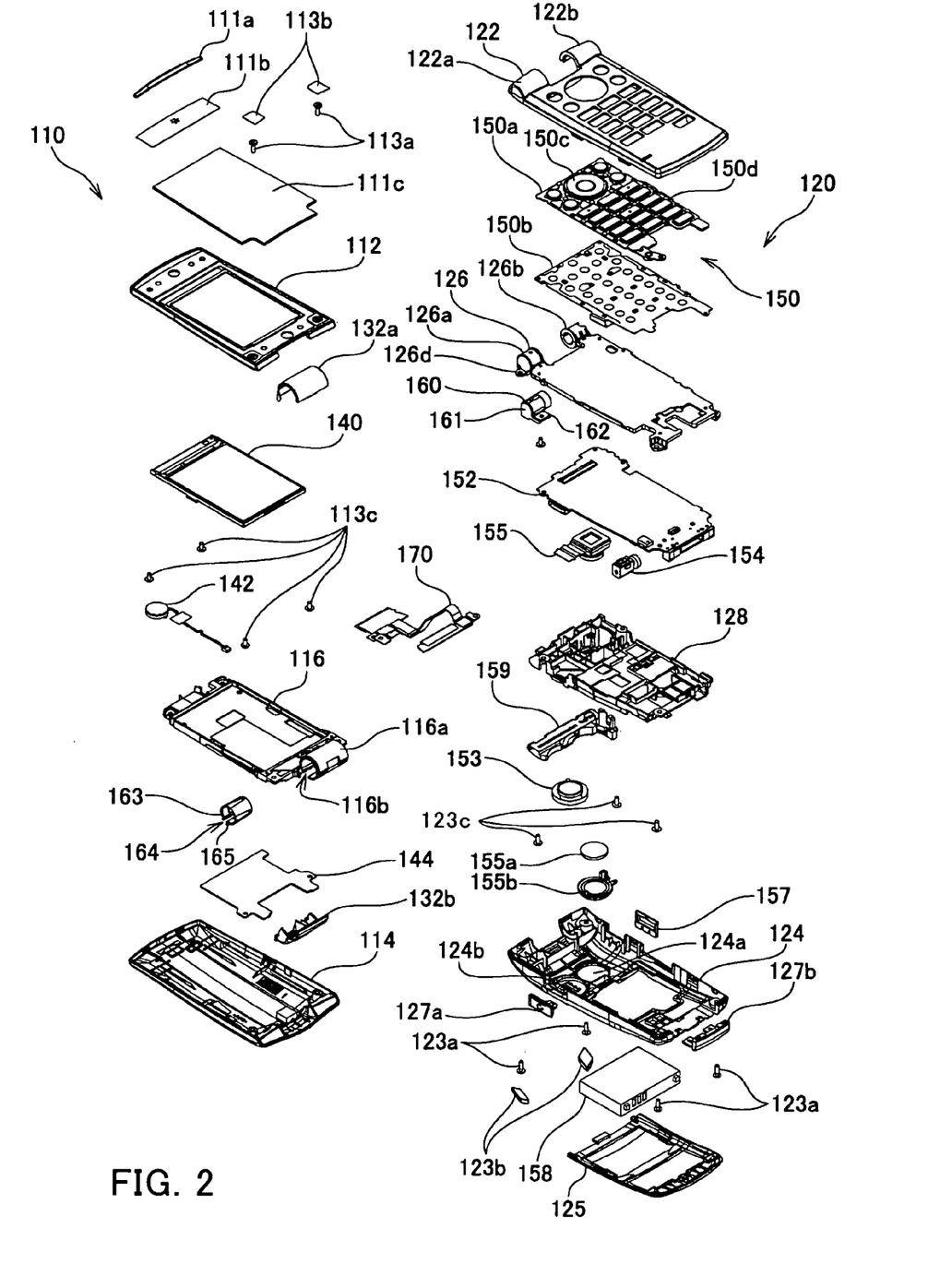
FIG. 2 is an exploded perspective view of the cell phone shown in FIGS. 1A-1E.

A description will be given of a cell phone 100 as one example of an inventive mobile radio communication apparatus, with reference to the accompanying drawings. Here, FIG. 1A is a left side view of the opening cell phone 100. FIG. 1B is a front view of the opening cell phone 100. FIG. 1C is a top view of the closed cell phone 100. FIG. 1D is a left side view of the closed cell phone 100. FIG. 1E is a rear view of the closed cell phone. FIG. 2 is an exploded perspective view of the cell phone 100.

The cell phone 100 is a foldable cell phone that foldably couples the movable-side housing 110 to the fixed-side housing 120 via a hinge part 130, and the movable-side housing 110 is configured to be rotatable relative to the fixed-side housing 120. A user can fold the movable-side housing 110 onto the fixed-side housing 120 as shown in FIG. 1D during a non-use period of the cell phone 100 by rotating the movable-side housing 110 in $a_1$ direction in FIG. 1A. In addition, before using, the user opens the movable-side housing 110 from the fixed-side housing 120, as shown in FIG. 1A, by rotating the folded movable-side housing 110 in $a_2$ direction shown in FIG. 1D.

The movable-side housing 110 has a housing structure that couples a front case 112 to a rear case 114, as shown in FIGS. 1B and 1C, installs an LCD holder (or movable-side chassis) 116, and houses a variety components, such as a display 140, a receiver 142, and a printed board 144, as shown in FIG. 2.

The front case 112 and the rear case 114 are formed, for example, by injection molding using ABS resin. Both are combined with each other by screws 113a, and each screw 113a is covered by a PET cap 113b. The printed board 144 and screws 113c used to fix the LCD holder 116 are provided inside the movable-side housing 110.

As shown in FIG. 2, a case pad 111a, a receiver panel 111b and a front panel 111c are attached to the front case 112.

The display 140 includes an LCD module that displays communication information, such as transmission information, reception information, address book information, information input by an operating part 150, and various functional information. The LCD module is held by the magnesium alloy LCD holder (movable-side chassis) 116.

The LCD holder 116 has a cylindrical part 116a that forms a convex 131b of the hinge part 131, which will be described later. The cylindrical part 116a is a hollow member having an approximately cylindrical shape and a groove 116b that extends in the longitudinal direction, and covered with an ABS front hinge cover 132a and ABS rear hinge cover 132b. The groove 116b is maintained even when the cylindrical part 116a is covered by the covers 132a and 132b. The groove 116b is an inlet for the flexible printed circuit board (FPC) 170, as described later.

The receiver 142 outputs voices of a communicate. The printed board 144 processes information displayed on the display 140 and information to be output from the receiver 142, and communicates with a printed board 152, which will be described later, via the FPC 170.

The fixed-side housing 120 also has a housing structure that couples a front case 122 to a rear case 124, as shown in FIGS. 1A, 1B and 1E. As shown in FIG. 2, the fixed-side housing 110 installs a key case (fixed-side chassis) 126 and a holder 128, and houses a variety components, such as the operating part 150, the printed board 152, a speaker 153, a vibrator 154, a camera 155, an IrDa panel 157, a battery 158, and an antenna 159.

The front case 122 and the rear case 124 are formed, for example, by injection molding using ABS resin. Both are combined with each other by screws 123a, and each screw 123a is covered by a PET screw cap 123b and a rear cover 125. Screws 123c used to fix the printed board 152 are provided inside the fixed-side housing 120. The front case 122 has cylindrical covers 122a and 122b that form convexes 131a and 131c of the hinge part 130. The rear case 124 is detachably coupled with the rear cover 125.

The operating part 150 has a pad 150a and a flexible module 150b, and the pad 150a is mounted with a track-ball type operating section 150c, and a ten-key type operating section 150d. The operating part 150 inputs communication information. Information is input from the pad 150a, and the flexible module 150b serves as a switch. The operating part 150 is held by a magnesium alloy key case 126 and a front case 122.

Figure 4:
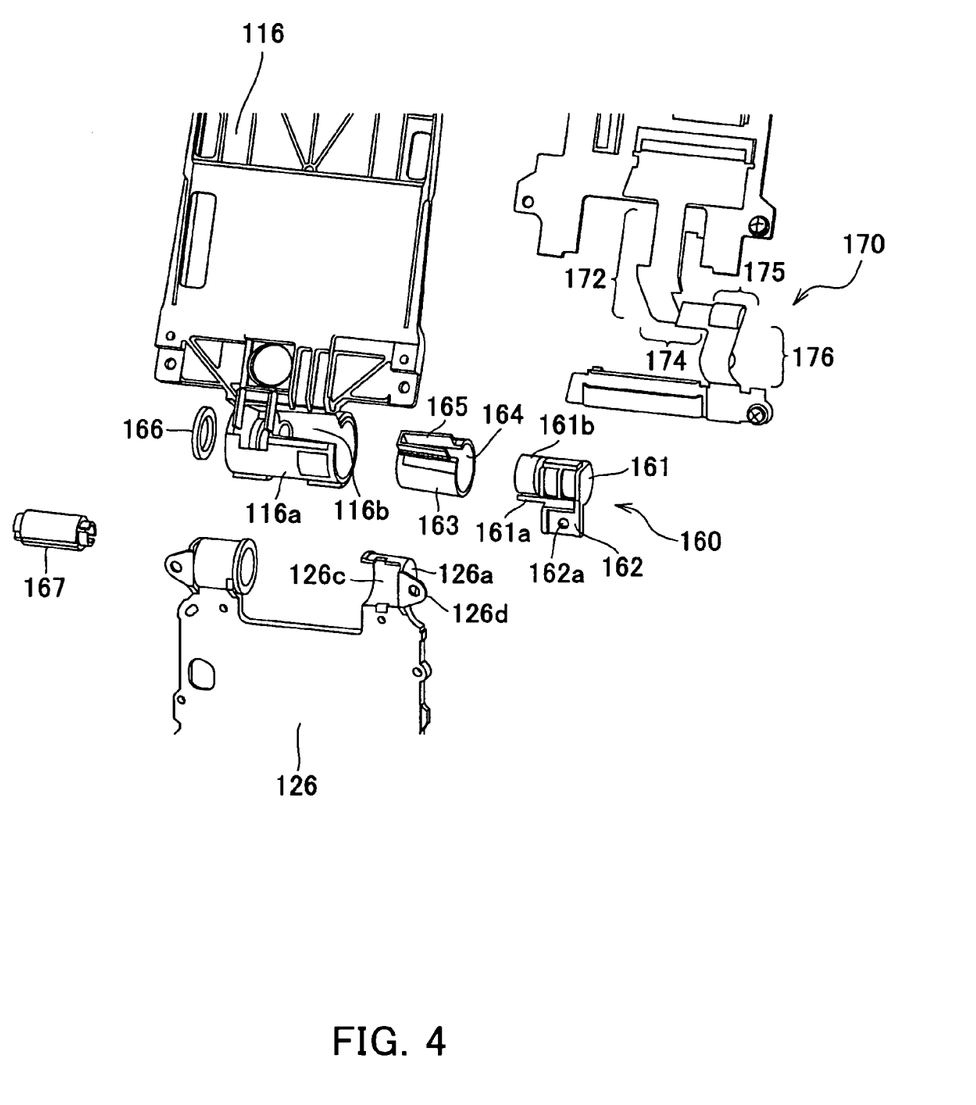
FIG. 4 is a rear-side exploded perspective view for explaining the assembly of the hinge part between the LCD holder and the key case shown in FIG. 2.

The key case 126 has cylindrical parts 126a and 126b that form convexes 131a and 131c of the hinge part 130, which will be described later. The cylindrical part 126a forms a hollow semicylinder accommodation part 126c that partially accommodates a base 161 of a center shaft 160, which will be described later. Referring to FIG. 4, which will be described later, the cylindrical part 126a has a screw hole 126d that fixes the fixing part 162 of the center shaft 160, which will be described later. The cylindrical part 126b is a hollow member having an approximately cylinder, and accommodates a hinge module 167, which will be described later.

The printed board 152 processes information input from the operation part 150, transmission and reception information, and other information, and transmits the information to the display 140. A microphone (not shown) through which a user speaks during calls is attached to the printed board 152. The printed board 152 is held by the ABS holder 128 and key case 126.

The printed board 152 has a terminal to which an earphone is connected, and a connection terminal with an external apparatus, such as a personal computer ("PC"), and these terminals are covered by rubber covers 127a and 127b attached to the rear case 124.

The speaker 153 outputs an incoming call sound, and is attached to an opening 124b in the rear case 124. The vibrator 154 transmits the incoming call through vibrations to the user instead of the sound.

The camera 155 is a module that takes both still and motion pictures. The macro switch ring 155b switches between a normal photographing mode and a zooming mode (or a focal point), and is attached to an opening 124a in the rear case 124. The acrylic out camera panel 155a is inserted into the ABS macro switch ring 155b, and protects a lens.

The IrDa panel 157 is used for short-distance infrared data transmissions. The battery 158 includes a battery pack as a secondary battery, and a rear cover 125 that shields and exposes it is attached detachably to the rear case 124. Screws 123a are provided under the rear cover 125, and couple the front case 122 to the rear case 124. The antenna 159 is used for communications with a base station.

The holder 128 holds the camera 155, the antenna 159, the speaker 153, and the vibrator 154.

A variety of components mounted on the fixed-side housing 120 may use any technology known in the art, and a detailed description thereof will be omitted.

The hinge part 130 foldably couples the movable-side housing 100 to the fixed-side housing 120, and has a divided structure. The hinge part 130 includes, as shown in FIG. 1B, a pair of convexes 131a and 131c, and a convex 131b provided on the movable-side housing 110 between the convexes 131a and 131c. While the hinge part 130 of this embodiment thus has a tripartite structure, the present invention does not limit the divided structure of the hinge part 130 to this embodiment and the hinge part 130 may have a quintuple structure and another divided structure.

Figure 3:
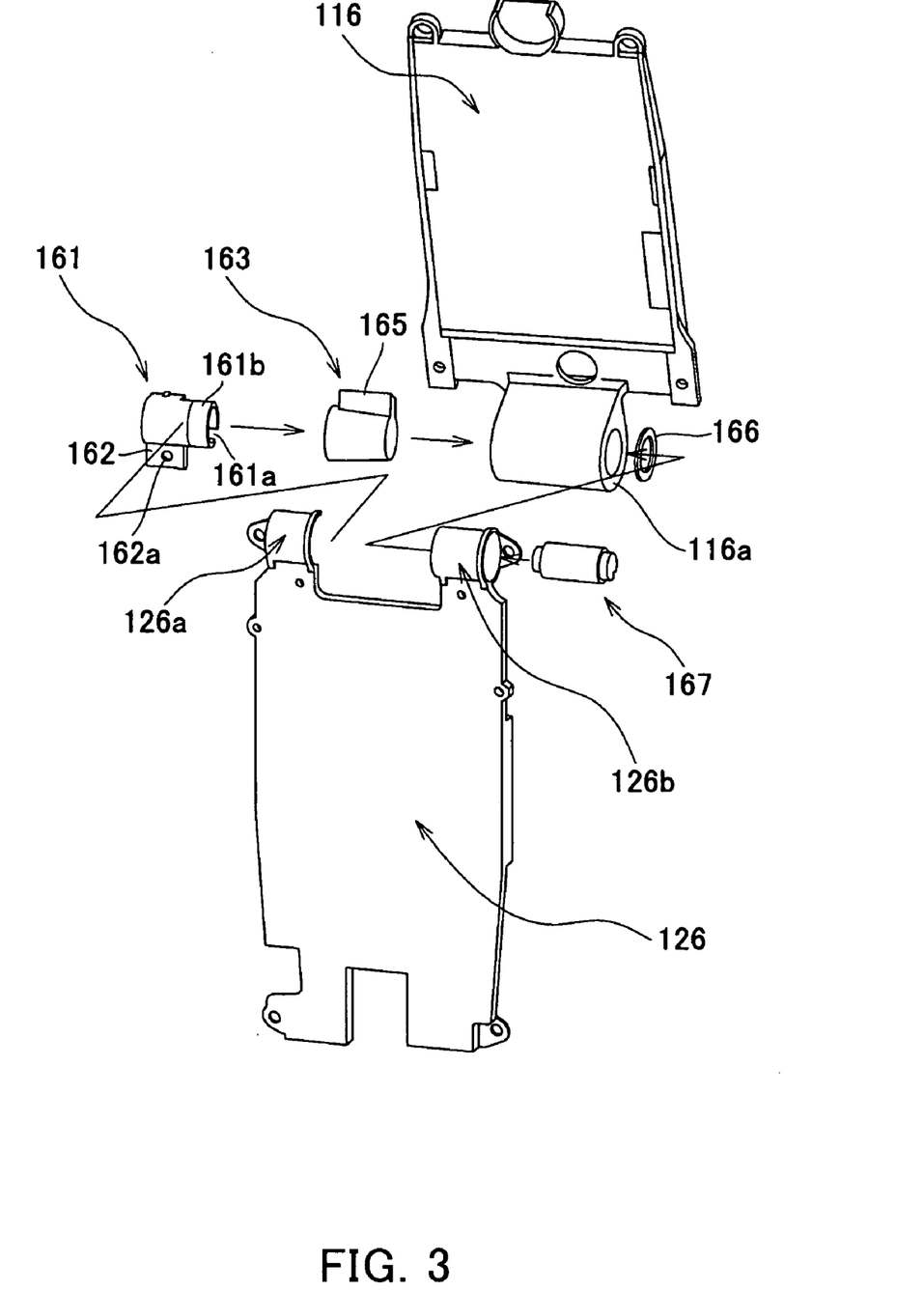
FIG. 3 is a front-side exploded perspective view for explaining an assembly of a hinge part between an LCD holder and a key case shown in FIG. 2.

A detailed description will be given of a structure of the hinge part 130, with reference to FIGS. 2 to 4. Here, FIG. 3 is a front-side exploded perspective view for explaining an assembly of the hinge part 130. FIG. 4 is a rear-side exploded perspective view for explaining the assembly of the hinge part 130.

As shown in FIG. 3, the convexes 131a to 131c form a hollow accommodation part, and the convex 131b rotates between the convexes 131a and 13 1c. As discussed above, the convex 131a includes the cylindrical part 126a and the cover 122a, and the convex 131c includes the cylindrical part 126b and the cover 122b. The convex 131b includes the cylindrical part 116a and the covers 132a and 132b. The hinge part 130 further includes the center shaft 160, a pipe 163, and the hinge module 167, and allows the FPC 170 to pass through it.

The center shaft 160 secures a path through which the FPC 170 passes from the hinge part 130. The center shaft 160 also serves to enhance the strength of the hinge part 130, and thus is made of metal, such as SUS and zinc. The center shaft 160 is provided in the hollow cylindrical part formed by the convex 131a, and has a base 161 and a fixing part 162.

The base 161 has an approximately cylindrical shape, and defines a hollow cylinder. The base 161 is fixed in the cylindrical part 126a and has a groove 161a and the engagement part 161b. The FPC 170 passes through the groove 161a and the opening in the center shaft 160 at the side of the center pipe 163. The engagement part 161b is a hollow cylinder provided at the tip of the base 161, projects from the cylindrical part 126a and is engaged with the center pipe 163. The engagement part 161b is provided in the convex 131b.

The fixing part 162 is a plate member that extends from the base 161, and has a screw hole 162a. The screw 162a is fixed in the screw hole 126d in the key case 126. As a result, the center shaft 160 is fixed onto the fixed-side housing 120.

The center pipe 163 secures a path through which the FPC 170 is introduced from the movable-side housing 110 into the hinge part 130 and extends along the longitudinal direction of the hinge part 130 to the center shaft 160. The center pipe 163 is made of a hollow cylinder member, and fixed onto the LCD holder 116. The center pipe 163 is made of polyoxymethylene ("POM"), and has a groove 164 and a projection 165. The center pipe 163 is partially engaged with the center shaft 160. While the center shaft 160 is fixed onto the key shaft 126 of the fixed-side housing 120, the center pipe 163 is fixed onto the LCD holder 116 of the movable-side housing 110 and rotates with the LCD holder 116. The FPC 170 passes through the groove 164 and the opening in the center pipe 163 at the side of the center shaft 160. The projection 165 extends perpendicularly from the groove 164 to the outside of the center pipe 163, and projects from and engages with the groove 116b. The projection 165 is engaged with the groove 116b, stabilizing a connection between the grooves 116b and 164.

While the hinge module 167 of this embodiment stores a free stop mechanism and a drawing mechanism, the present invention does not require the hinge module to include all of these functions. Here, the free stop function is a function that maintains an angle between the movable-side housing 110 and the fixed-side housing 120 at an arbitrary angle. The drawing mechanism is a function that automatically completes opening and closing of the movable-side housing 110 when its angle becomes the full opening angle or completely folded angle.

The hinge module 167 is inserted into the cylindrical part 126b and partially projects from the convex 131b. In attachment, a bush 166 shown in FIG. 4 is engaged with the hinge module 167 and then they are squeezed into the convex 131c of the hinge part 130. Since the hinge module can apply any structure known in the art, a detailed description thereof will be omitted.

The FPC 170 electrically connects the printed board 144 to the printed board 152. The FPC 170 of this embodiment has a crank-type structure in which the FPC 170 is twisted and bent in the hinge part 130. The crank-type structure can make the hinge part 130 smaller than the curl-type structure in which the FPC 170 is curled once in the hinge part 130, and has an effect of miniaturization of the entire cell phone 100. The FPC 170 has a layered structure that coats plural parallel signal lines with an insulating member, such as polyimide resin. For example, the FPC 170 has a three-layer structure that includes a central layer as a signal line, and both layers as a frame ground ("FG") line. The number of layers in the FPC 170 is not limited, and the signal line and the insulating material may apply any technology known in the art, and a detailed description thereof will be omitted.

Figure 5:
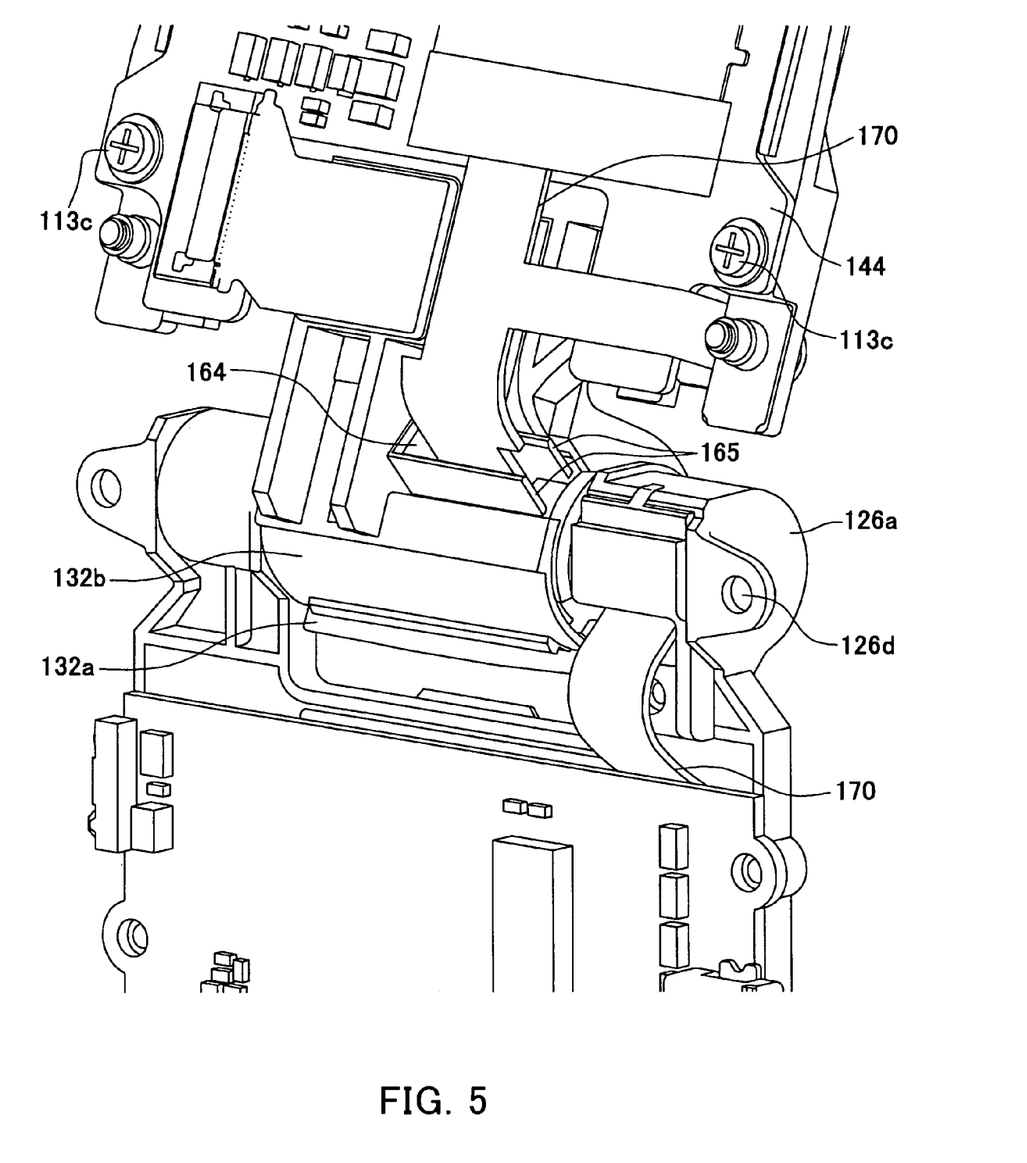
FIG. 5 is a rear-side perspective view for explaining the assembled hinge part between the LCD holder and the key case shown in FIG. 2.

The crank-type FPC 170 has a bending structure shown in FIGS. 2, 4 and 5. Here, FIGS. 2 and 4 are perspective views of the pre-attached FPC 170, and FIG. 5 is a partially enlarged perspective view of the post-attached FPC 170. The FPC 170 is fixed onto the printed board 144 on the rear side of the LCD holder 116 (or opposite to the display 140). Since the printed board 144 is screwed onto the rear surface of the LCD holder 116, as shown in FIG. 5, the FPC 170 is eventually fixed onto the rear surface of the LCD holder 116.

In FIG. 4, the FPC 170 is classified into a movable area 172, an in-hinge area 174, and a fixed area 176. The movable area 172 contains an area of the FPC 170, which exposes on the movable-side housing 110 and an area that has not yet been introduced into the hinge part 130 (or a visible upper area of the FPC 170 in FIG. 5). The in-hinge area 174 contains an area of the FPC 170, which is accommodated in the hinge part 130, (or an invisible area of the FPC 170 in FIG. 5). The fixed area 176 contains an area of the FPC 170, which exposes on the fixed-side housing 120 and an area which is introduced from the hinge part 130 (or a visible lower area of the FPC 170 in FIG. 5).

The FPC 170 has an end surface 175 in the in-hinge area 174. In the foldable cell phone as in this embodiment, the path of the FPC 170 when the movable-side housing 110 opens is longer than that when the movable-side housing 110 closes. Since the FPC's path length is thus different between the opening and closing states of the movable-side housing 110, the FPC 170 is pulled too tight to close, torn or stretched out so that its internal circuit is broken, if the FPC 170's length is set to the path length when the movable-side housing opens. Therefore, the FPC 170's length should be set based on the path length in the closing state of the movable-side housing. Thus, the FPC 170 has an extra length to the path length when the movable-side housing 110 opens, as shown in FIG. 6A.

Figure 6A:
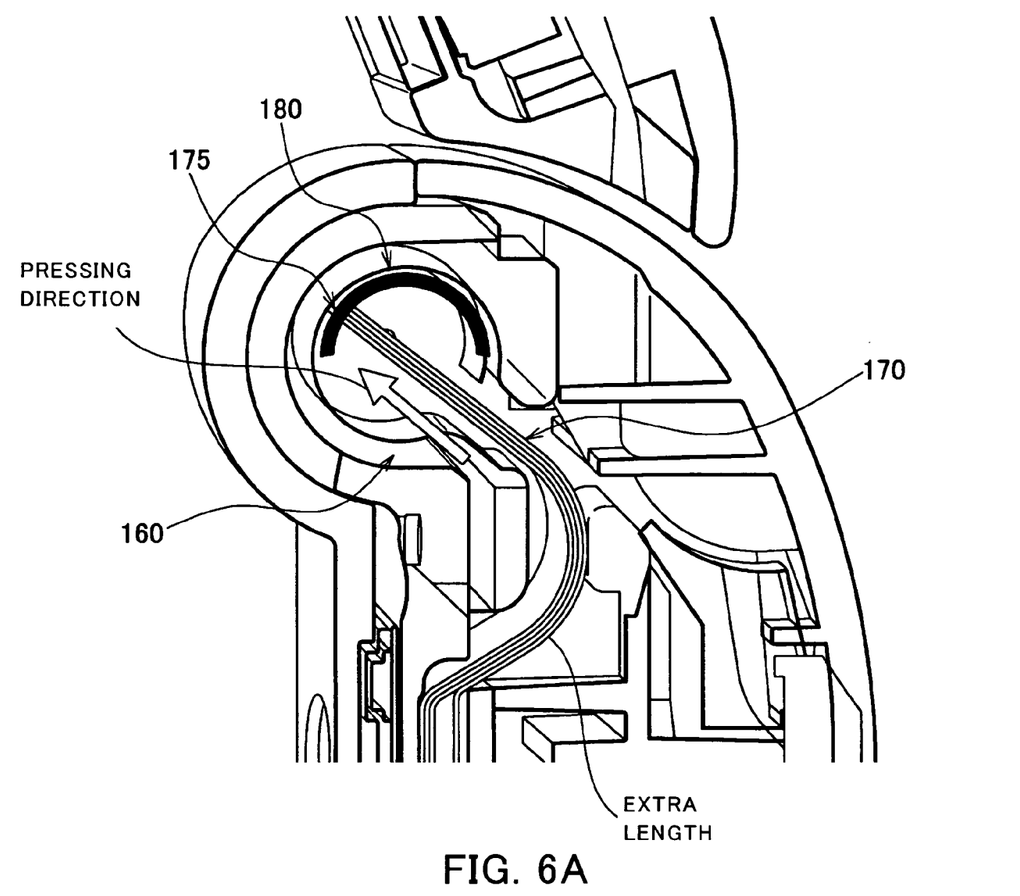
FIG. 6A is a sectional view of the hinge part having a protection means according to a first embodiment of the present invention.

However, due to this extra length, the end surface 175 can be pressed against the internal surface of the center shaft 160 of the hinge part 130 when the movable-side housing 110 is opened and closed, as shown by an arrow in FIG. 6A, possibly generating the rustle of frictional noises, and lowering the operability or operational comfort. The substrate of the FPC 170 is made generally of resin and the center shaft 160 is made of metal. Therefore, when the end surface 175 and hinge part 130 rub against each other, the end surface 175 wears away. As the FPC 170's wear advances, the FPC 170's signal line exposes and breaks, consequently lowering the durability of the foldable cell phone 100.

Accordingly, the cell phone 100 includes a protection means that protects the end surface 175 of the FPC 170 from contacts with the center shaft 160 of the hinge part 130 and wears. The protection means thus protects the end surface 175 from contacts with the center shaft 160 and wears, prevents the frictional noises and the disconnection of the signal line, and improves the operability and durability.

Figure 6B:
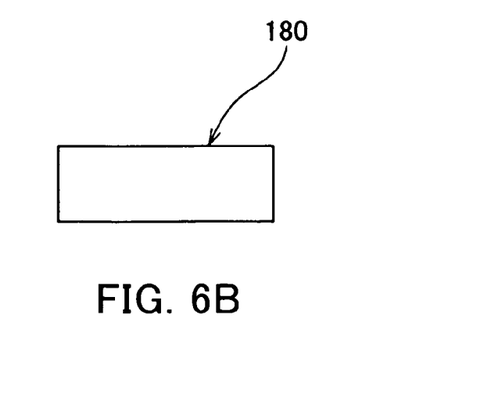
FIG. 6B is a plane view of the protection means.

The protection means of the first embodiment is a resin tape 180 that is adhered onto the internal surface of the center shaft 160, prevents the contact between the end surface 175 of the FPC 170 and the center shaft 160, and contacts the end surface 175, as shown in FIG. 6A. The resin tape 180 is adhered to the inner surface of the center shaft 160. The FPC 170 is made of resin, and the wear is mitigated in case of a contact between resin and resin in comparison with a contact between resin and metal. The resin is made of Teflon, Kapton, and POM, etc. The resin tape 180 is a rectangular tape having a predetermined width, as shown in FIG. 6B, and covers a range in which the end surface 175 moves on the internal surface of the center shaft 160. The adhesive ageing may use anything known in the art. Here, FIG. 6B is a plane view of the resin member 180 as the resin tape. The thickness of the resin tape 180 is preferably maintained within several millimeters, because the excessive thickness causes a large size of the hinge part 130.

Figure 7:
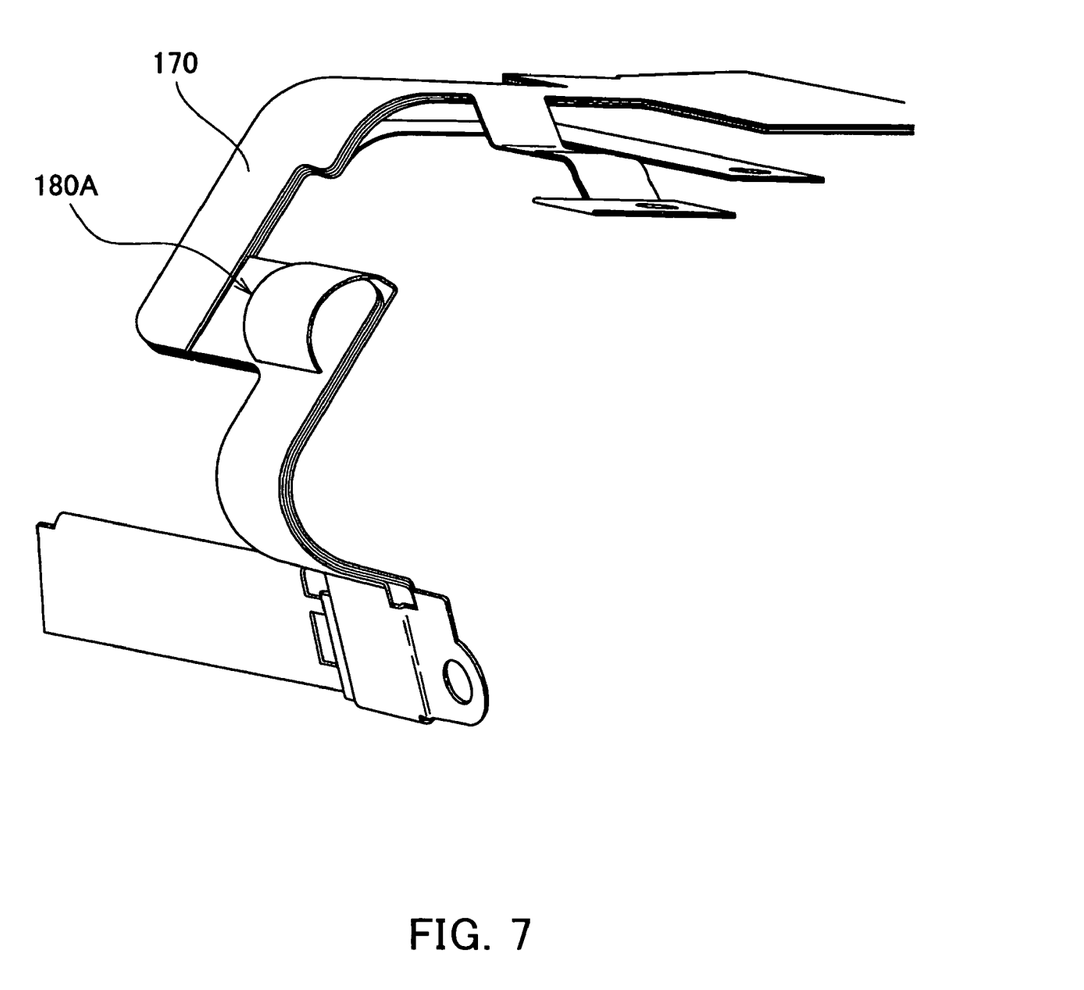
FIG. 7 is a perspective view of a flexible printed circuit board having a protection means according to a second embodiment of the present invention.

The resin tape 180 is a separate member from the FPC 170, but may be integrated together. The protection means of a second embodiment is an extended (or tongue) part 180A that is provided onto the FPC 170, as shown in FIG. 7, extends along the internal surface of the center shaft 160, and contacts the center shaft 160 instead of the end surface 175. The tongue part 180A provides a surface contact with the center shaft 160, instead of a linear contact like the end surface 175, improving the slip characteristic on the internal surface of the center shaft 160, and reducing the friction. Here, FIG. 7 is a perspective overview of the tongue part 180A that serves as the protection means of the second embodiment.

In FIG. 7, the tongue part 180A covers the end surface 175, is positioned closer to the center shaft 160 than the end surface 175, and extends along the internal surface of the center shaft 160.

The tongue part 180A may be part of the FPC 170, or may be a separate member fixed to the FPC 170 via adhesive or another means. However, the tongue part 180A as part of the FPC 170 eliminates the adhesion step, facilitates the assembly, and reduces the cost by reducing the number of components. When the FPC 170 has a three-layer structure as described above, the member 180A that serves as the protection means may be one of both the FG line layers. In this case, the lowermost layer is bent upwardly or the upper most layer is bent downwardly, covering and protecting the end surface 175. Preferably, the protective layer dispenses with a signal line of the FPC 170, thereby preventing the breakdown of the signal line.

Figure 8:
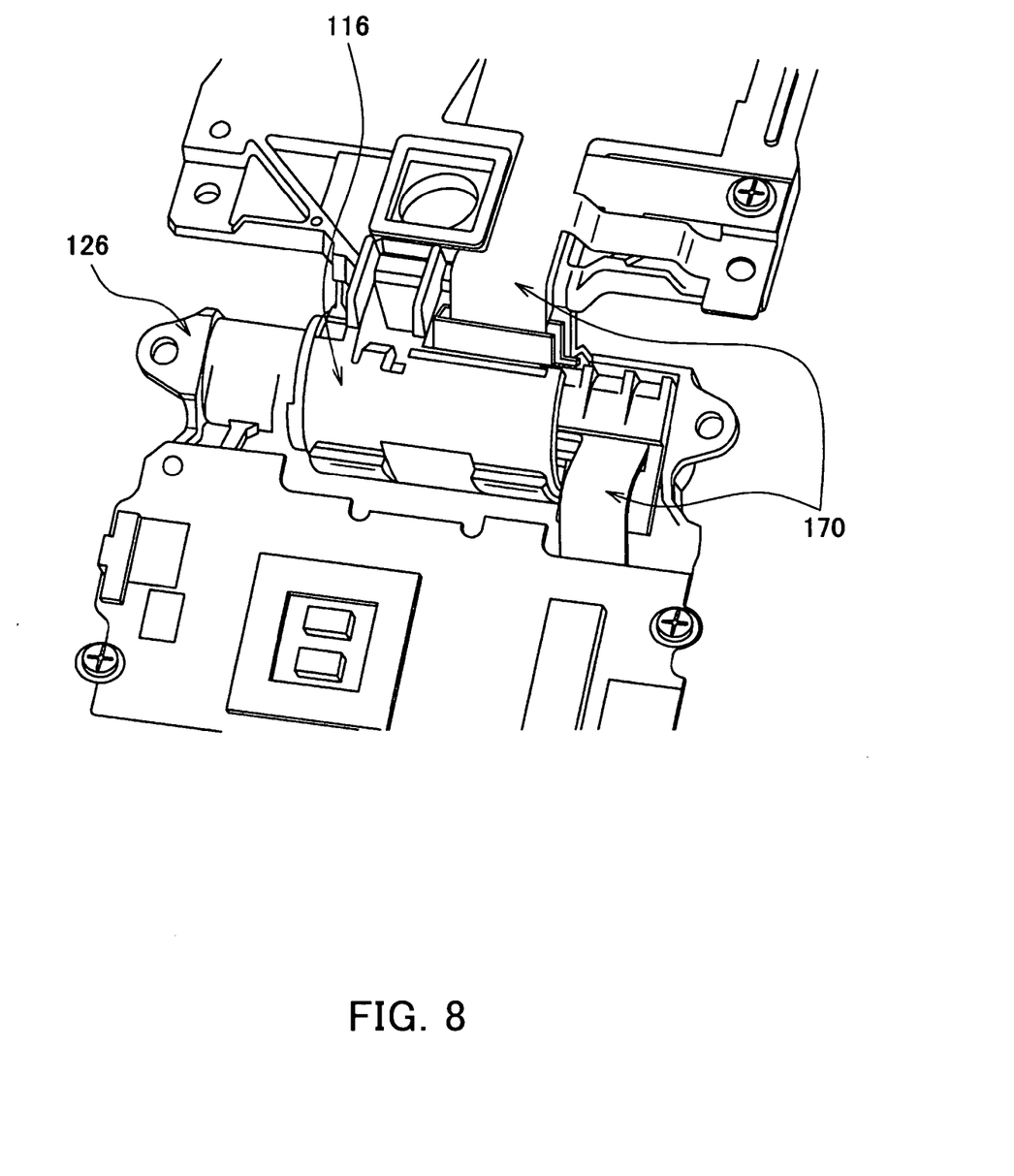
FIG. 8 is a partially enlarged perspective view of the LCD holder and the key case near the hinge part, which uses the flexible printed circuit board having the protection means shown in FIG. 7.
Figure 9:
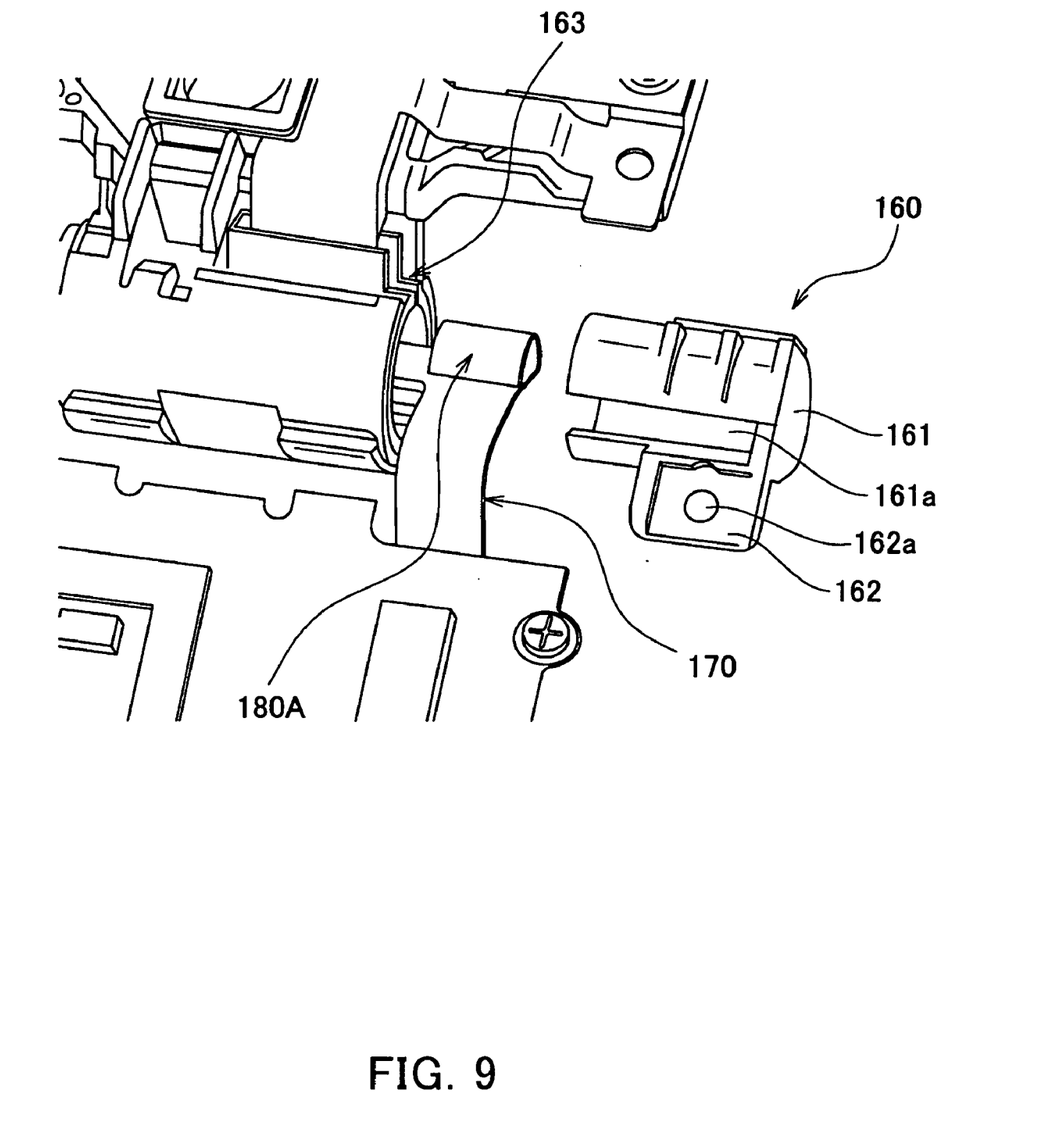
FIG. 9 is an enlarged perspective view of FIG. 8 from which the key case is removed and a center shaft is exploded.
Figure 10:
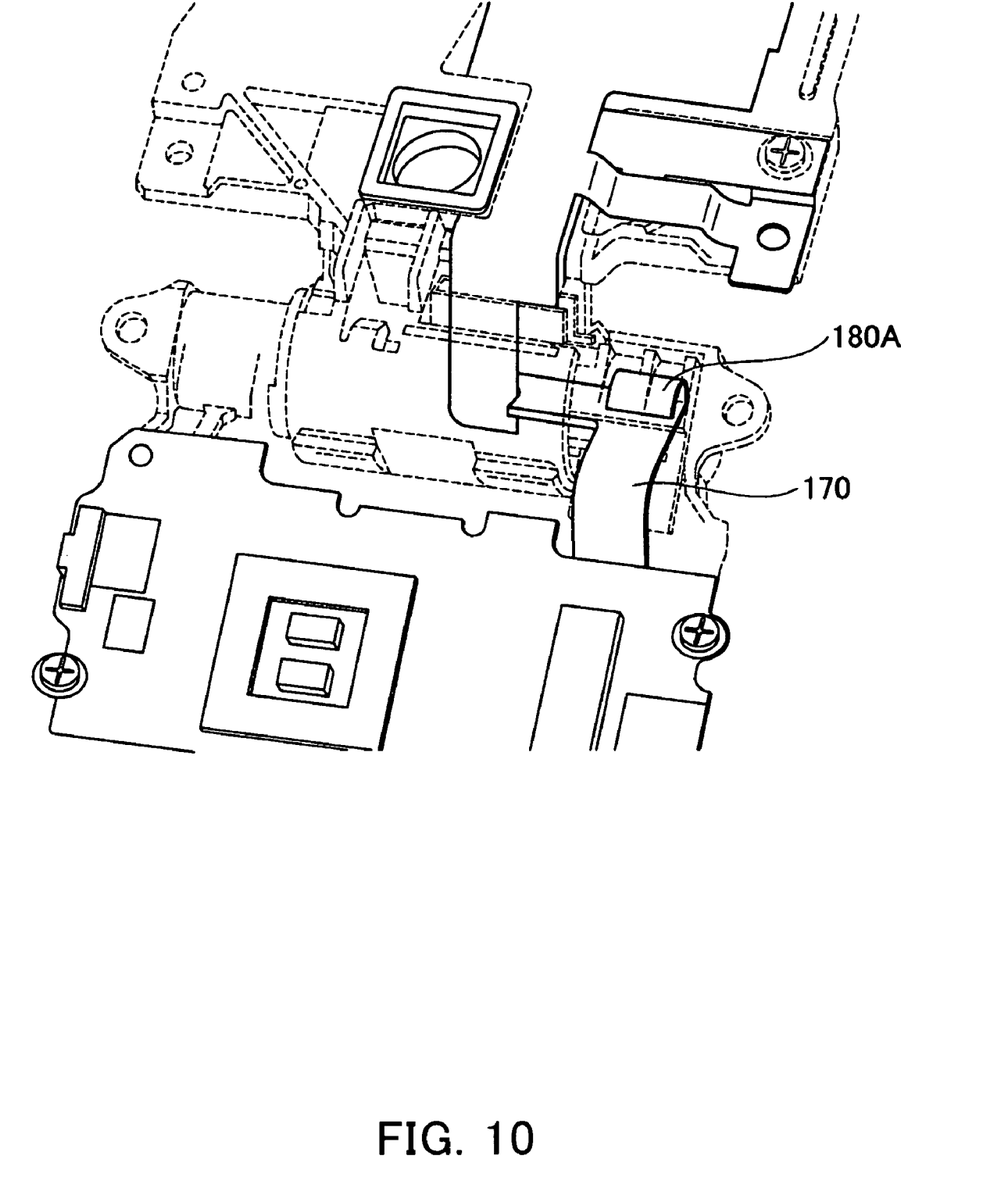
FIG. 10 is a transparent perspective view of FIG. 8.

Similar to FIG. 5, FIG. 8 is a partially enlarged perspective view of the LCD holder 116 and the key case 126 near the hinge part 130 when the FPC 170 has the tongue part 180A. FIG. 9 is an enlarged perspective view that removes the key case 126 from FIG. 8 and explodes the center shaft 160. FIG. 10 is a transparent perspective view of the FPC 170 shown in FIG. 8.

While a non-FPC cable, such as a coaxial cable of an antenna and a power supply cable, may be attached onto the FPC 170, the illustration is omitted. Of course, the FPC 170 and the non-FPC may be separate and independently pass through the hinge part 130.

In operation, the user opens and closes the movable-side housing 110 relative to the fixed-side housing 120 using the functions of the hinge module 167. In this case, the protection means prevents the end surface 175 of the FPC 170 from contacting the inner surface of the center shaft 160 and becoming worn away, thereby eliminating or reducing the frictional noises and breakdown of the signal line. As a result, the protection means can improve the operability and durability of the cell phone 100. When the movable-side housing 110 opens, the user can implement various functions, such as a call, through the operating part 150. In addition, the crank-type FPC 170 makes the hinge part 130 smaller than the curl-type FPC, reducing the size, weight, and cost of the cell phone 100.

Further, the present invention is not limited to these preferred embodiments, and various variations and modifications may be made without departing from the scope of the present invention.

Thus, the present invention can provide a foldable information processing apparatus that adopts the crank-type FPC for the miniaturization of the apparatus and improves the operability and durability.

What is claimed is:

1. A foldable information processing apparatus comprising:
   a hinge part that foldably couples two housings with each other;
   a crank-type structured flexible printed circuit board having a fixed area, a movable area and an in-hinge area therebetween that enters said hinge part through a groove thereof and passes through said hinge part and electrically connects two printed circuit boards located in said two housings, respectively; and
   a protector that protects an end surface of said flexible printed circuit board from a contact with said hinge part, said end surface being a portion of said in-hinge area that is opposed to said groove, wherein said protector is a resin member including a tape that is provided to be disposed on an inner surface of said hinge part and separates the end surface of said flexible printed circuit board from said hinge part.

2. A foldable information processing apparatus comprising:
- a hinge part that foldably couples two housings with each other;
- a crank-type structured flexible printed circuit board having a fixed area, a movable area and an in-hinge area therebetween that enters said hinge part through a groove thereof and passes through said hinge part and electrically connects two printed circuit boards located in said two housings, respectively; and
- a protector that protects an end surface of said flexible printed circuit board from a contact with said hinge part, said end surface being a portion of said in-hinge area that is opposed to said groove,
- wherein said protector is a member that is provided to be disposed on said flexible printed circuit board, extends along an inner surface of said hinge part, and separates said hinge part from the end surface of said flexible printed circuit board.

3. A foldable information processing apparatus according to claim 2, wherein said member is a part of said flexible printed circuit board.

4. A foldable information processing apparatus according to claim 2, wherein said flexible printed circuit board includes plural layers, and the member is one of layers at both end layers in the plural layers.

5. A foldable information processing apparatus according to claim 3, wherein the member dispenses with a signal line in said flexible printed circuit board.

6. A foldable information processing apparatus comprising:
- a hinge part that couples two housings with each other;
- a crank-type structured flexible printed circuit board that passes through said hinge part, and electrically connects two printed circuit boards located in said two housings;
- a first protector that is provided on said flexible printed circuit board, extends along an inner surface of said hinge part, and contacts said hinge in substitute for the end surface of said flexible printed circuit board; and
- a second protector that is a tongue part that extends from a part of said flexible printed circuit board, and contacts said hinge part.

* * * * *